United States Patent [19]
Norimatsu

[11] Patent Number: 5,276,408
[45] Date of Patent: Jan. 4, 1994

[54] PLL FREQUENCY SYNTHESIZER CAPABLE OF CHANGING AN OUTPUT FREQUENCY AT A HIGH SPEED

[75] Inventor: Hidehiko Norimatsu, Tokyo, Japan
[73] Assignee: NEC Corporation, Japan
[21] Appl. No.: 933,988
[22] Filed: Aug. 21, 1992

Related U.S. Application Data

[62] Division of Ser. No. 781,093, Oct. 22, 1991, Pat. No. 5,173,665.

[30] Foreign Application Priority Data

Oct. 22, 1990 [JP] Japan ................................ 2-281784
Nov. 24, 1990 [JP] Japan ................................ 2-318629
May 16, 1991 [JP] Japan ................................ 3-141420

[51] Int. Cl.⁵ .......................... H03L 7/093; H03L 7/18
[52] U.S. Cl. .......................................... 331/8; 331/16; 331/17; 331/25
[58] Field of Search ........................ 331/8, 16, 17, 25

[56] References Cited
U.S. PATENT DOCUMENTS 4,745,372  5/1988  Miwa ............................ 331/17 X
5,068,626 11/1991  Takagi et al. ................. 331/25 X
5,095,288  3/1992  Dent ............................. 331/17

*Primary Examiner*—Siegfried H. Grimm
*Attorney, Agent, or Firm*—Ostrolenk, Faber, Gerb & Soffen

[57] ABSTRACT

In a frequency synthesizer, a first pulse removing circuit (31) is connected between a reference signal generator (21) and a phase-frequency comparator (24). A second pulse removing circuit (32) is connected between a variable frequency divider (23) and the phase-frequency comparator. Responsive to first removing data indicative of a first pulse number, the first pulse removing circuit removes pulses from the reference signal that are equal in number to the first pulse number for a first predetermined cycle to produce a first pulse removed signal. Responsive to second removing data indicative of a second pulse number, the second pulse removing circuit removes pulses from the divided signal that are equal in number to the second pulse number for a second predetermined cycle to produce a second pulse removed signal. Responsive to a current command, a current controlling circuit may control current supplied from/to a charge pump circuit (25). A control circuit may be connected between the phase-frequency comparator and the charge pump circuit. A switch may be inserted between the loop filter and the voltage controlled oscillator. When the switch switches off a PLL, a D/A converter supplies a control voltage to the voltage controlled oscillator and a filter capacitor of the loop filter. The charge pump circuit may comprise a control circuit, a constant current circuit, an integrating circuit, and a sample and hold circuit.

3 Claims, 12 Drawing Sheets

PLL FREQUENCY SYNTHESIZER CAPABLE OF CHANGING AN OUTPUT FREQUENCY AT A HIGH SPEED

This is a division of application Ser. No. 07/781,093, filed Oct. 22, 1991, now U.S. Pat. No. 5,173,665.

BACKGROUND OF THE INVENTION

This invention relates to a frequency synthesizer with a phase-locked loop (PLL). Such a frequency synthesizer is called a PLL frequency synthesizer.

As well known in the art, the PLL frequency synthesizer comprises a reference signal generator, a voltage controlled oscillator, a variable frequency divider, a phase-frequency comparator, and a control voltage supplying circuit. The reference signal generator generates a reference signal with a reference frequency. Responsive to a control voltage signal, the voltage controlled oscillator generates a voltage controlled signal having a controllable oscillating frequency. The PLL frequency synthesizer produces the voltage controlled signal as an output signal. Therefore, the output signal has an output frequency equal to the controllable oscillating frequency. The output signal is supplied to the variable frequency divider. The variable frequency divider is also supplied with a designated dividing number D which defines the output frequency, where D represents a positive integer. The variable frequency divider frequency divides the output signal on the basis of the designated dividing number D to produce a divided signal. In other words, the variable frequency divider is for frequency dividing the output signal by a factor 1/D. The phase-frequency comparator is supplied with the reference signal and the divided signal. The phase-frequency comparator detects a phase-frequency difference between the reference signal and the divided signal to produce a phase-frequency difference signal indicative of the phase-frequency difference. In other words, the phase-frequency difference signal indicates one of lag and lead phases which the divided signal has in comparison with the reference signal. Responsive to the phase-frequency difference signal, the control voltage supplying circuit supplies the control voltage signal to the voltage controlled oscillator.

More specifically, the control voltage supplying circuit comprises a current flow control circuit and a loop filter. Responsive to the phase-frequency difference signal, the current flow control circuit controls flow-in and flow-out of current supplied therefrom/to to produce a current flow control signal. The current flow control signal indicates the flow-out of the current when the phase-frequency difference signal indicates the lag phase. The current flow control signal indicates the flow-in of the current when the phase-frequency difference signal indicates the lead phase. Supplied with the current flow control signal, the loop filter filters the current flow control signal into a filtered signal as the control voltage signal. More particularly, the loop filter comprises a filter capacitor which is selectively charged and discharged when the current flow control signal indicates the flow-out and the flow-in of the current, respectively.

In a conventional PLL frequency synthesizer, changing of the output frequency is carried out by changing step by step the designated dividing number D. Therefore, the PLL frequency synthesizer has a variable delay amount on changing the output frequency. As a result, a frequency error of the output frequency occurs in the PLL frequency synthesizer on changing the output frequency. Accordingly, the conventional PLL frequency synthesizer is defective in that it is impossible to change the output frequency at a high speed.

SUMMARY OF THE INVENTION

It is therefore an object of the present invention to provide a PLL frequency synthesizer which is capable of changing an output frequency at a high speed.

Other objects of this invention will become clear as the description proceeds.

According to a first aspect of this invention, a frequency synthesizer comprises a reference signal generator for generating a reference signal with a reference frequency, a voltage controlled oscillator responsive to a control voltage signal for generating an output signal having an output frequency, a variable frequency divider supplied with the output signal and responsive to a designated dividing number defining the output frequency for frequency dividing the output signal on the basis of the designated dividing number to produce a divided signal, a first pulse removing circuit supplied with the reference signal and responsive to first removing data indicative of a first pulse number for removing pulses from the reference signal that are equal in number to the first pulse number for a first predetermined cycle to produce a first pulse removed signal, a second pulse removing circuit supplied with the divided signal and responsive to second removing data indicative of a second pulse number for removing pulses from the divided signal that are equal in number to the second pulse number for a second predetermined cycle to produce a second pulse removed signal, a phase-frequency comparator supplied with the first and the second pulse removed signals for detecting a phase-frequency difference between the first and the second pulse removed signals to produce a phase-frequency difference signal indicative of the phase-frequency difference, and a control voltage supplying circuit supplied with the phase-frequency difference signal for supplying the control voltage signal to the voltage controlled oscillator in response to the phase-frequency difference signal.

According to a second aspect of this invention, a frequency synthesizer comprises a reference signal generator for generating a reference signal with a reference frequency, a voltage controlled oscillator responsive to a control voltage signal for generating an output signal having an output frequency, a variable frequency divider supplied with the output signal and responsive to a designated dividing number defining the output frequency for frequency dividing the output signal on the basis of the designated dividing number to produce a divided signal, a phase-frequency comparator supplied with the reference signal and the divided signal for detecting a phase-frequency difference between the reference signal and the divided signal to produce a phase-frequency difference signal indicating one of lag and lead phases which the divided signal has in comparison with the reference signal, a current flow control circuit responsive to the phase-frequency difference signal for controlling flow-in and flow-out of current supplied therefrom/to to produce a current flow control signal, a loop filter supplied with the current flow control signal for filtering the current flow control signal into a filtered signal as the control voltage signal, and a current controlling circuit responsive to a current command for controlling the current supplied from/to the current flow control circuit.

According to a third aspect of this invention, a frequency synthesizer comprises a reference signal generator for generating a reference signal with a reference frequency, a voltage controlled oscillator responsive to a control voltage signal for generating an output signal having an output frequency, a variable frequency divider supplied with the output signal and responsive to a designated dividing number defining the output frequency for frequency dividing the output signal on the basis of the designated dividing number to produce a divided signal, a phase-frequency comparator supplied with the reference signal and the divided signal for detecting a phase-frequency difference between the reference signal and the divided signal to produce a phase-frequency difference signal indicating one of lag and lead phases which the divided signal has in comparison with the reference signal, a current flow control circuit responsive to the phase-frequency difference signal for controlling flow-in and flow-out of current supplied therefrom/to to produce a current flow control signal, and a loop filter supplied with the current flow control signal for filtering the current flow control signal into a filtered signal as the control voltage signal. The above-mentioned current flow control circuit comprises a control circuit responsive to the phase-frequency difference signal for producing first through third control signals, a constant current circuit responsive to the first control signal for producing a constant current, an integrating circuit having an initial voltage for integrating the constant current to an integrated voltage, the integrating circuit being reset from the integrated voltage to the initial voltage in response to the second control signal, and a sample and hold circuit responsive to the third control signal for sampling the integrated voltage to hold a sampled voltage as a held signal, the sample and hold circuit producing the held signal as the current flow control signal.

According to a fourth aspect of this invention, a frequency synthesizer comprises a reference signal generator for generating a reference signal with a reference frequency, a voltage controlled oscillator responsive to a control voltage signal for generating an output signal having an output frequency, a variable frequency divider supplied with the output signal and responsive to a designated dividing number defining the output frequency for frequency dividing the output signal on the basis of the designated dividing number to produce a divided signal, a phase-frequency comparator supplied with the reference signal and the divided signal for detecting a phase-frequency difference between the reference signal and the divided signal to produce a phase-frequency difference signal indicative of the phase-frequency difference, modifying means connected to the phase-frequency comparator and responsive to a control enable signal for modifying the phase-frequency difference signal into a modified signal, and a control voltage supplying circuit supplied with the modified signal for supplying the control voltage signal to the voltage controlled oscillator in response to the modified signal.

According to a fifth aspect of this invention, a frequency synthesizer comprises a reference signal generator for generating a reference signal with a reference frequency, a voltage controlled oscillator responsive to a control voltage signal for generating an output signal having an output frequency, a variable frequency divider supplied with the output signal and responsive to a designated dividing number defining the output frequency for frequency dividing the output signal on the basis of the designated dividing number to produce a divided signal, a phase-frequency comparator supplied with the reference signal and the divided signal for detecting a phase-frequency difference between the reference signal and the divided signal to produce a phase-frequency difference signal indicative of the phase-frequency difference, a current flow control circuit responsive to the phase-frequency difference signal for controlling flow-in and flow-out of current therefrom/to to produce a current flow control signal, a loop filter supplied with the current flow control signal for filtering the current flow control signal into a filtered signal, the loop filter comprising a filter capacitor which is selectively charged and discharged in accordance with the current flow control signal, a control circuit supplied with the phase-frequency difference signal and the designated dividing number for producing a control signal and voltage data on changing the output frequency, the voltage data representing a control voltage which is defined by the designated dividing number on the basis of the phase-frequency difference signal, a switch inserted between the loop filter and the voltage controlled oscillator for switching off in response to the control signal, and a digital-analog converter supplied with the voltage data for converting the voltage data into the control voltage, the digital-analog converter supplying the control voltage to the voltage controlled oscillator and the filter capacitor of the loop filter.

DESCRIPTION OF THE PREFERRED EMBODIMENTS

Figure 1:
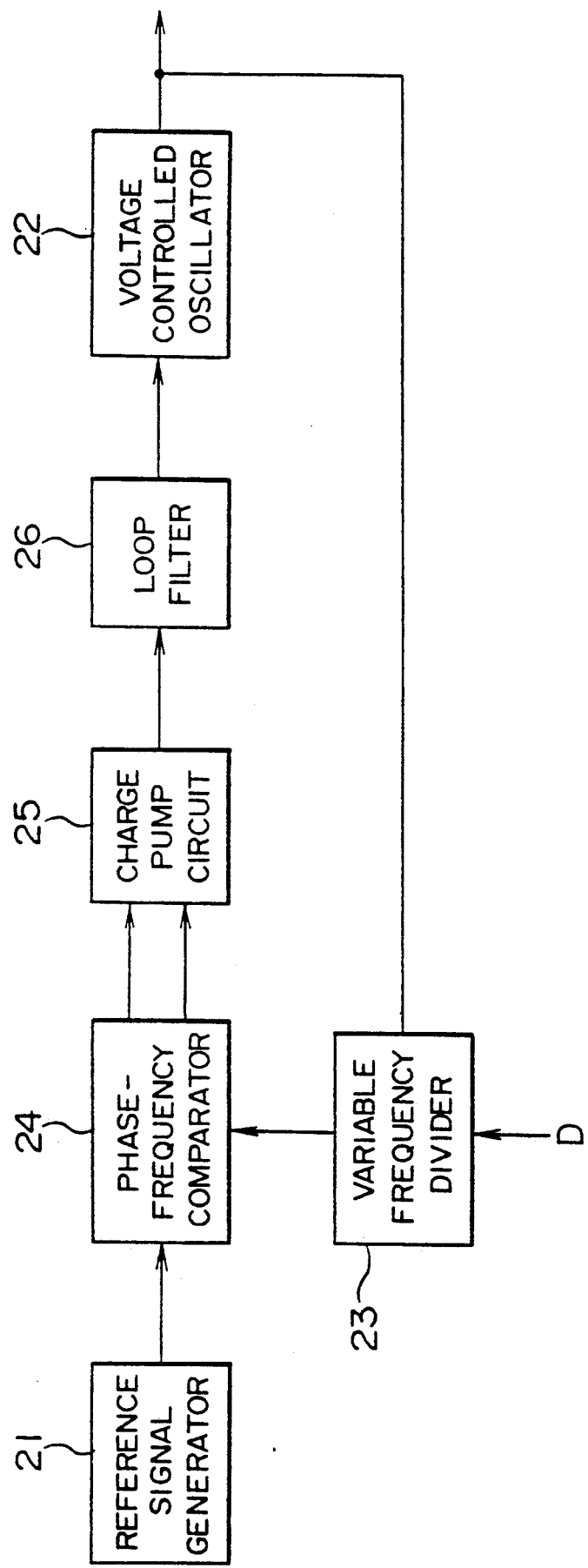
FIG. 1 is a block diagram of a conventional PLL frequency synthesizer.

Referring to FIG. 1, a conventional PLL frequency synthesizer will be described at first in order to facilitate an understanding of the present invention.

The PLL frequency synthesizer comprises a reference signal generator 21, a voltage controlled oscillator 22, a variable frequency divider 23, a phase-frequency comparator 24, a charge pump circuit 25, and a loop filter 26.

The reference signal generator 21 generates a reference signal with a reference frequency. The voltage controlled oscillator 22 is supplied with a control voltage signal in the manner which will become clear as the description proceeds. Responsive to the control voltage signal, the voltage controlled oscillator 22 generates a voltage controlled signal having a controllable oscillating frequency. The PLL frequency synthesizer produces the voltage controlled signal as an output signal. Therefore, the output signal has an output frequency equal to the controllable oscillating frequency.

The output signal is supplied to the variable frequency divider 23. The variable frequency divider 23 is also supplied with a designated dividing number D which defines the output frequency, where D represents a positive integer. The variable frequency divider 23 frequency divides the output signal on the basis of the designated dividing number D to produce a divided signal. In other words, the variable frequency divider 23 is for frequency dividing the output signal by a factor 1/D. The phase-frequency comparator 24 is supplied with the reference signal and the divided signal. The phase-frequency comparator 24 detects a phase-frequency difference between the reference signal and the divided signal to produce a phase-frequency difference signal indicative of the phase-frequency difference. In other words, the phase-frequency difference signal indicates one of lag and lead phases which the divided signal has in comparison with the reference signal.

The phase-frequency difference signal is supplied with the charge pump circuit 25. The charge pump circuit 25 acts as a current flow control circuit which is for controlling flow-in and flow-out of current supplied therefrom/to to produce a current flow control signal. The current flow control signal indicates the flow-out of the current when the phase-frequency difference signal indicates the lag phase. The current flow control signal indicates the flow-in of the current when the phase-frequency difference signal indicates the lead phase. The current flow control signal is supplied with the loop filter 26. The loop filter filters the current flow control signal into a filtered signal as the control voltage signal. More particularly, the loop filter 26 comprises a filter capacitor (not shown) which is selectively charged and discharged when the current flow control signal indicates the flow-out and the flow-in of the current, respectively. At any rate, a combination of the charge pump circuit 25 and the loop filter 26 serves as a control voltage supplying circuit for supplying the control voltage signal to the voltage controlled oscillator in response to the phase-frequency difference signal.

As apparent from the above description, the PLL frequency synthesizer produces the output signal having the output frequency which is equal to D times as large as the reference frequency of the reference signal. It is therefore possible to change the output frequency by changing the designated dividing number D. In the conventional PLL frequency synthesizer, changing of the output frequency is carried out by changing step by step the designated dividing number D. As a result, the conventional PLL frequency synthesizer is defective in that it is impossible to change the output frequency at a high speed, as mentioned in the preamble of the instant specification.

Figure 2:
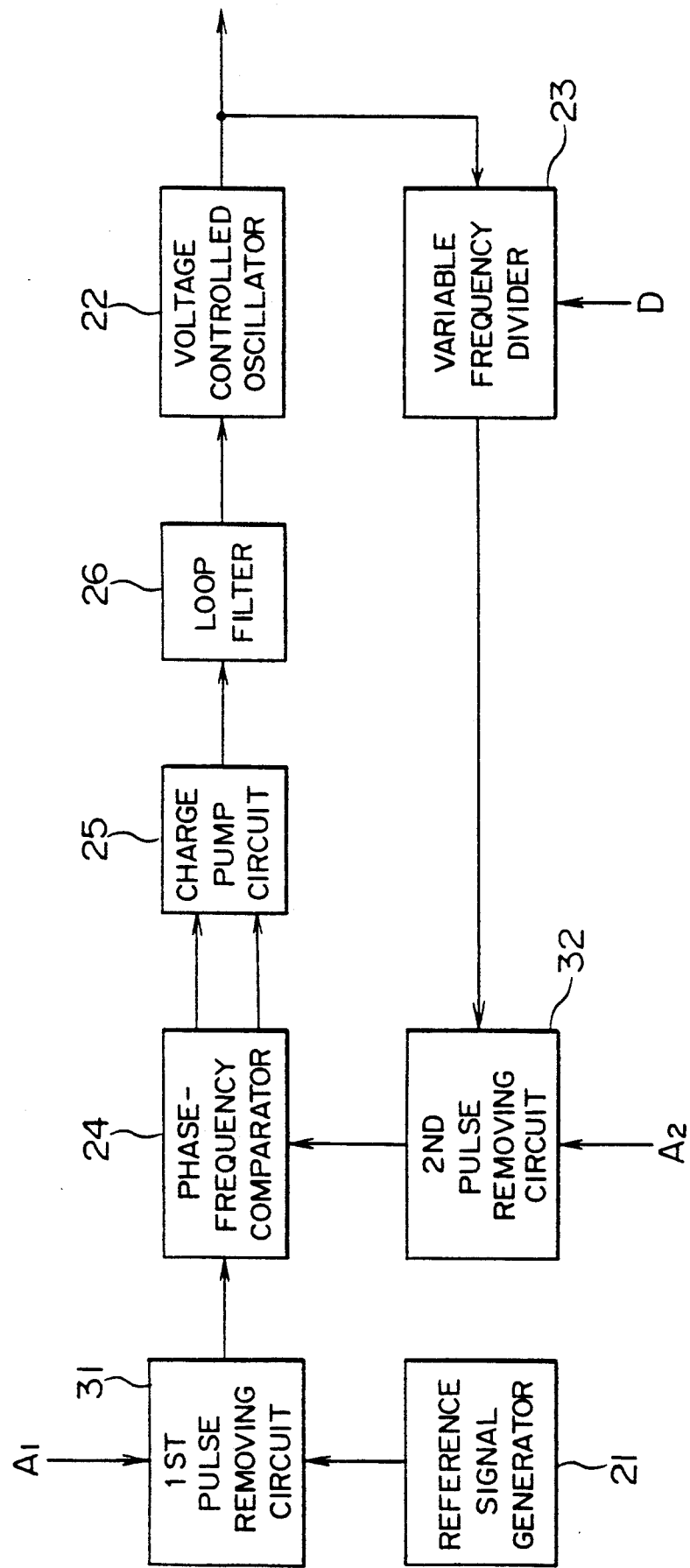
FIG. 2 is a block diagram of a PLL frequency synthesizer according to a first embodiment of the instant invention.

Referring to FIG. 2, the description will proceed to a PLL frequency synthesizer according to a first embodiment of this invention. The PLL frequency synthesizer is similar in structure and operation to the conventional PLL frequency synthesizer illustrated in FIG. 1 except that the PLL frequency synthesizer further comprises first and second pulse removing circuits 31 and 32.

The first pulse removing circuit 31 is connected between the reference signal generator 21 and the phase-frequency comparator 24. The second pulse removing circuit 32 is connected between the variable frequency divider 23 and the phase-frequency comparator 24.

The first pulse removing circuit 31 is supplied with the reference signal from the reference signal generator 21 and first removing data A1 indicative of a first pulse number. Responsive to the first removing data A1, the first pulse removing circuit 31 removes pulses from the reference signal that are equal in number to the first pulse number for a first predetermined cycle to produce a first pulse removed signal. Instead of the reference signal, the first pulse removed signal is supplied to the phase-frequency comparator 24.

The second pulse removing circuit 32 is supplied with the divided signal from the variable frequency divider 23 and second removing data A2 indicative of a second pulse number. The second pulse removing circuit 32 removes pulses from the divided signal that are equal in number to the second pulse number for a second predetermined cycle to produce a second pulse removed signal. Instead of the divided signal, the second pulse removed signal is supplied to the phase-frequency comparator 24.

Therefore, the phase-frequency comparator 24 detects a phase-frequency difference between the first and the second pulse removed signals to produce a phase-frequency difference signal indicative of the phase-frequency difference.

Figure 3:
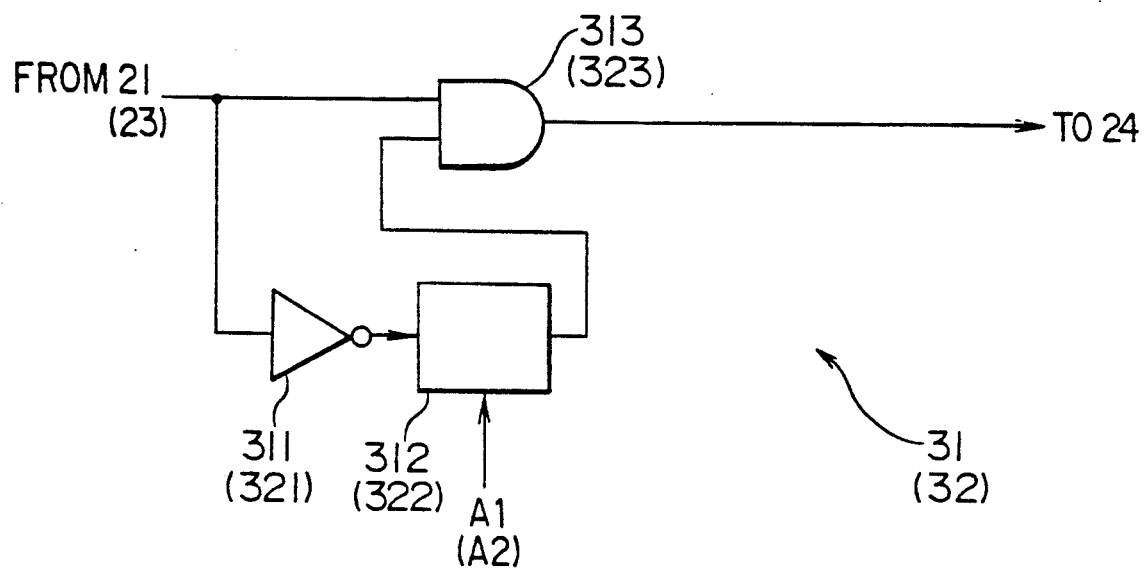
FIG. 3 is a block diagram of a pulse removing circuit for use in the PLL frequency synthesizer illustrated in FIG. 2.

Turning to FIG. 3, the first pulse removing circuit 31 comprises a first inverter 311, a first counter 312, and a first AND gate 313. The first inverter 311 is supplied with the reference signal from the reference signal generator 21 (FIG. 2) as a first input pulse signal. The first inverter 311 inverts the first input pulse signal to produce a first inverted pulse signal. The first inverter 311 is connected to the first counter 312 which is supplied with the first pulse removing data. The first counter 312 counts up a first count in synchronism with the first inverted pulse signal. The first counter 312 produces a first time-up signal when the first count increases up to the first pulse number. The first time-up signal is supplied to the first AND gate 313 which is supplied with the first input pulse signal. Responsive to the first input pulse signal and the first time-up signal, the first AND gate 313 produces a first AND'ed signal as the first pulse removed signal.

Similarly, the second pulse removing circuit 32 comprises a second inverter 321, a second counter 322, and a second AND gate 323. The second inverter 321 is supplied with the divided signal from the variable frequency divider 23 (FIG. 2) as a second input pulse signal. The second inverter 321 inverts the second input pulse signal to produce a second inverted pulse signal. The second inverter 321 is connected to the second counter 322 which is supplied with the second pulse removing data. The second counter 322 counts up a second count in synchronism with the second inverted pulse signal. The second counter 322 produces a second time-up signal when the second count increases up to the second pulse number. The second time-up signal is supplied to the second AND gate 323 which is supplied with the second input pulse signal. Responsive to the second input pulse signal and the second time-up signal, the second AND gate 323 produces a second AND'ed signal as the second pulse removed signal.

Figure 4:
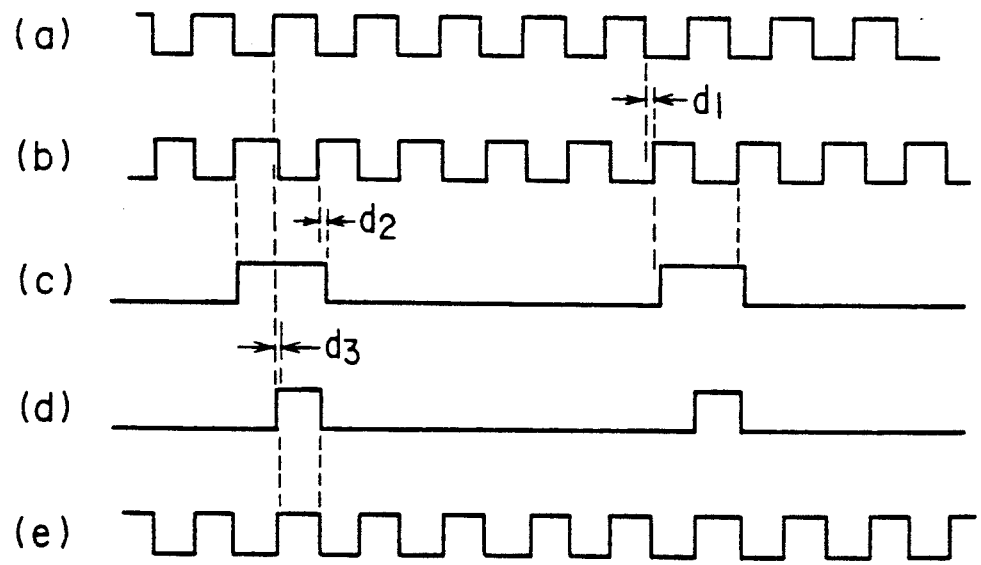
FIG. 4 shows a time chart for use in describing operation of the pulse removing circuit illustrated in FIG. 3.

Turning to FIG. 4, (a) through (e), description will be made as regards operation of the first pulse removing circuit 31. The first input pulse signal is depicted along FIG. 4(a). The first input pulse signal is inverted by the first inverter 311 into the first inverted pulse signal as shown in FIG. 4(b). The first inverter 311 has an inverting delay time denoted to d1.

It will be assumed that the first counter 312 is supplied with the first pulse removing data indicative of the first pulse number equal to four. In this event, the first counter 312 counts up the first count at a leading edge of each pulse in the first inverted pulse signal. The first counter 312 produces the first time-up signal of a logical "1" level when the first count increases up to the first pulse number, namely, four, as shown in FIG. 4(c). The first counter 312 is reset to produce the first time-up signal of a logical "0" level in response to another leading edge of the next succeeding pulse of the first inverted pulse signal. The first counter 312 has a counting delay time denoted to d2. Under the circumstances, the first AND gate 313 produces the first AND'ed signal as the first pulse removed signal as shown in FIG. 4(d). That is, the first AND gate 313 produces the first pulse removed signal having pulses which are one-fifth as large as those of the first input pulse signal. In other words, the first pulse removing circuit 31 removes four pulses from the reference signal for the first predetermined cycle which has five pulses. The first AND gate 313 has a gate delay time denoted to d3.

If the first pulse removing data indicates the first pulse number equal to zero, the first counter 312 continuously produces the first time-up signal with the logical "1" level. In this event, the first AND gate 313 produces the first pulse removed signal to which the first input pulse signal is delayed for the gate delay time t3 by the first AND gate 313 as shown in FIG. 4(e).

Operation of the second pulse removing circuit 32 is similar to that of the first pulse removing circuit 31 and the description thereof is therefore omitted.

Figure 5:
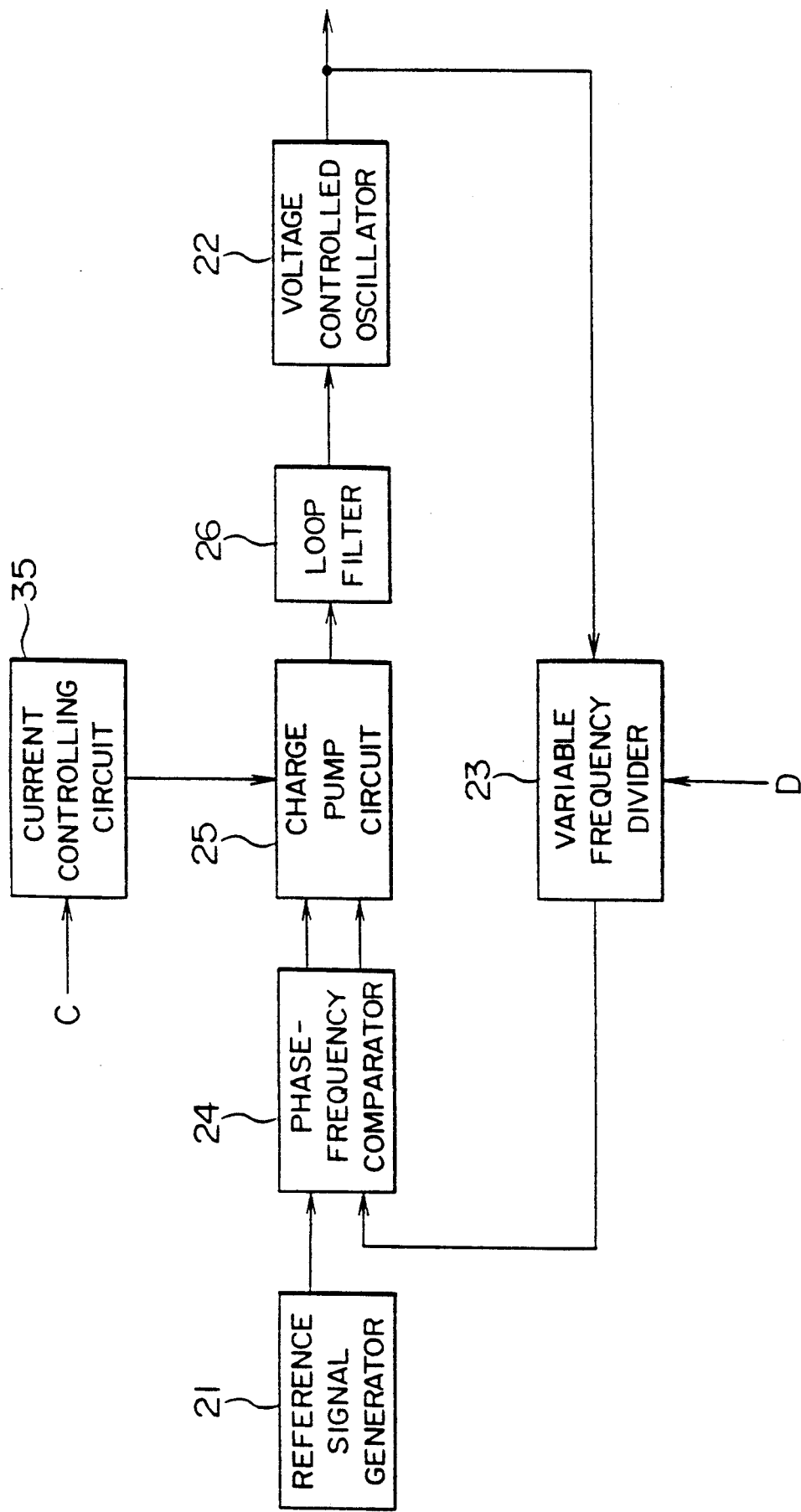
FIG. 5 is a block diagram of a PLL frequency synthesizer according to a second embodiment of the instant invention.

Referring to FIG. 5, the description will proceed to a PLL frequency synthesizer according to a second embodiment of this invention. The PLL frequency synthesizer is similar in structure and operation to the conventional PLL frequency synthesizer illustrated in FIG. 1 except that the PLL frequency synthesizer further comprises a current controlling circuit 35.

The current controlling circuit 35 is connected to the charge pump circuit 25 and is supplied with a current command C. Responsive to the current command C, the current controlling circuit 35 controls the current for the charge pump circuit 25. More specifically, the current command C is present while the output frequency is changed. The current controlling circuit 35 controls the current so as to increase the current when the current command C is present and then to gradually decrease the current after the current command C becomes absent. A little more in detail, the current controlling circuit 35 comprises a charge-up control circuit and a discharge control circuit. The current command C comprises charge-up and discharge indication signals. The charge-Up and discharge indication signals of the current command are present one at a time while the output frequency is changed. In a manner which will later become clear, the charge-up control circuit controls charge-up of the loop filter in response to the charge-up indication signal while the discharge control circuit controls discharge of the loop filter in response to the discharge indication signal.

Figure 6:
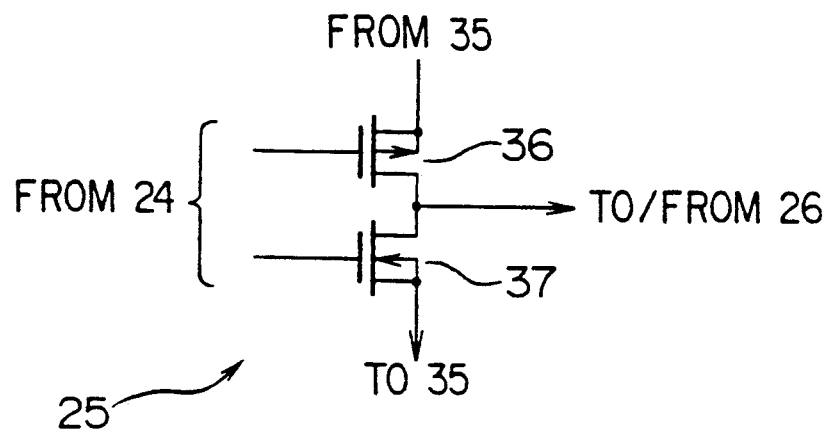
FIG. 6 is a block diagram of a charge pump circuit for use in the PLL frequency synthesizer illustrated in FIG. 5.

Turning to FIG. 6, the charge pump circuit 25 comprises a complementary-symmetry metal-oxide-semiconductor field-effect transistor (CMOSFET) which consists of a p-channel MOSFET 36 and an n-channel MOSFET 37. Each of the MOSFETs 36 and 37 has a gate terminal, a drain terminal, and a source terminal. The p-channel and the n-channel MOSFETs 36 and 37 are joined at their drain terminals which are connected to the loop filter 26 (FIG. 5). The p-channel MOSFET 36 has the source terminal which is connected to the charge-up control circuit of the current controlling circuit 35. The n-channel MOSFET 37 has the source terminal which is connected to the discharge control circuit of the current controlling circuit 35. Both of the p-channel and the n-channel MOSFETs 36 and 37 have the gate terminals which are connected to the phase-frequency comparator 24 (FIG. 5). More particularly, the phase-frequency difference signal comprises lag and lead phase signals which indicate the lag and the lead phases, respectively. The lag phase signal is supplied to the gate terminal of the p-channel MOSFET 36. The lead phase signal is supplied to the gate terminal of the n-channel MOSFET 37.

Supplied with the lag phase signal, the p-channel MOSFET 36 is put into an ON state, thereby the current flows from the charge-up control circuit to the loop filter 26 through the p-channel MOSFET 36. Supplied with the lead phase signal, the n-channel MOSFET 37 is put into an ON state, thereby the current flows from the loop filter 26 to the discharge control circuit through the n-channel MOSFET 37.

Figure 7:
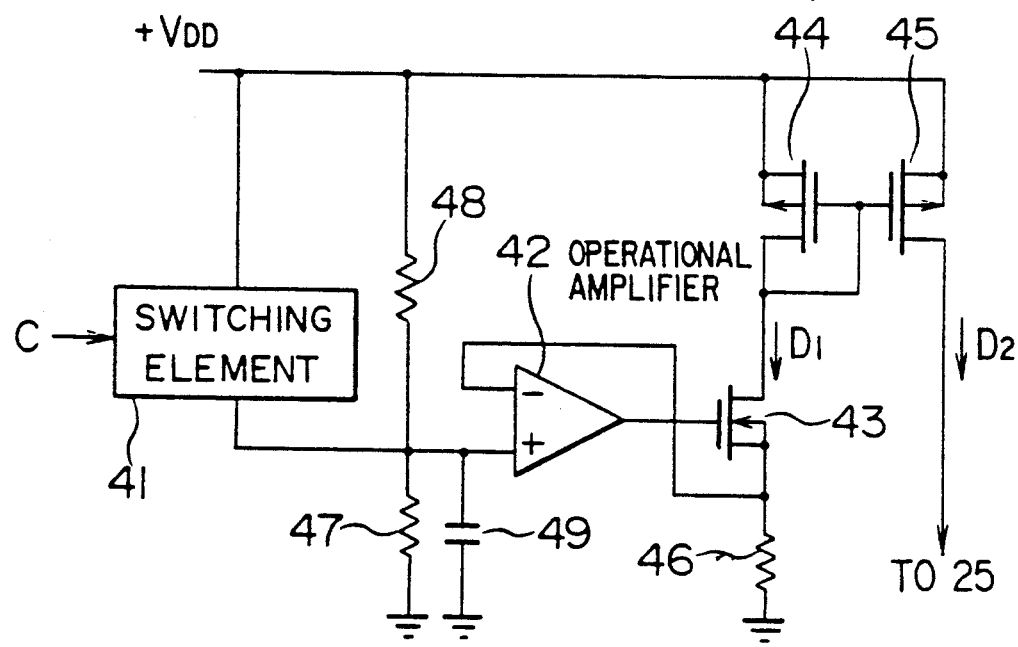
FIG. 7 is a block diagram of a charge-up control circuit of a current controlling circuit for use in the PLL frequency synthesizer illustrated in FIG. 5.

Turning to FIG. 7, the charge-up control circuit of the current controlling circuit 35 comprises a switching element 41, an operational amplifier 42, an n-channel MOSFET 43, first and second p-channel MOSFETs 44 and 45, first through third resistors 46, 47, and 48, and a capacitor 49. The operational amplifier 42 has an inverting input terminal, a noninverting input terminal, and an amplifier output terminal.

The switching element 41 has a control input terminal supplied with the charge-up indication signal of the current command C. The switching element 41 is supplied with a positive source voltage $+V_{DD}$. The switching element 41 is connected to the noninverting input terminal of the operational amplifier 42. When the charge-up indication signal of the current command C is present or has a logic one value, the switching element 41 turns on, thereby the positive source voltage $+V_{DD}$ is supplied to the noninverting input terminal of the operational amplifier 42. The inverting input terminal of the operational amplifier 42 is connected to an end of the first resistor 46 which has another end grounded. The noninverting input terminal of the operational amplifier 42 is connected to an end of the second resistor 47 which has another end grounded. The second resistor 47 is connected to the capacitor 49 in parallel. The noninverting input terminal of the operational amplifier 42 is also connected to an end of the third resistor 48 which has another end supplied with the positive source voltage $+V_{DD}$. The amplifier output terminal of the operational amplifier 42 is connected to the gate terminal of the n-channel MOSFET 43 which has the source terminal connected to the inverting input terminal of the operational amplifier 42.

The n-channel MOSFET 43 has the drain terminal which is connected to the drain terminal of the first p-channel MOSFET 44. The drain terminal of the n-channel MOSFET 43 is also connected to the gate terminals of the first and the second p-channel MOSFETs 44 and 45. Both of the first and the second p-channel MOSFETs 44 and 45 have the source terminals which are supplied with the positive source voltage $+V_{DD}$. The second p-channel MOSFET 45 has the drain terminal which is connected to the source terminal of the p-channel MOSFET 36 (FIG. 6). Therefore, a combination of the first and the second p-channel MOSFETs 44 and 45 composes a current Miller circuit. The second p-channel MOSFET 45 has a gate width which is N times as large as that of the first p-channel MOSFET 44, where N represents a predetermined number. When a first drain current $D_1$ flows through the n-channel MOSFET 43, through the second p-channel MOSFET 45 flows a second drain current $D_2$ which is N times as large as the first drain current $D_1$.

Figure 8:
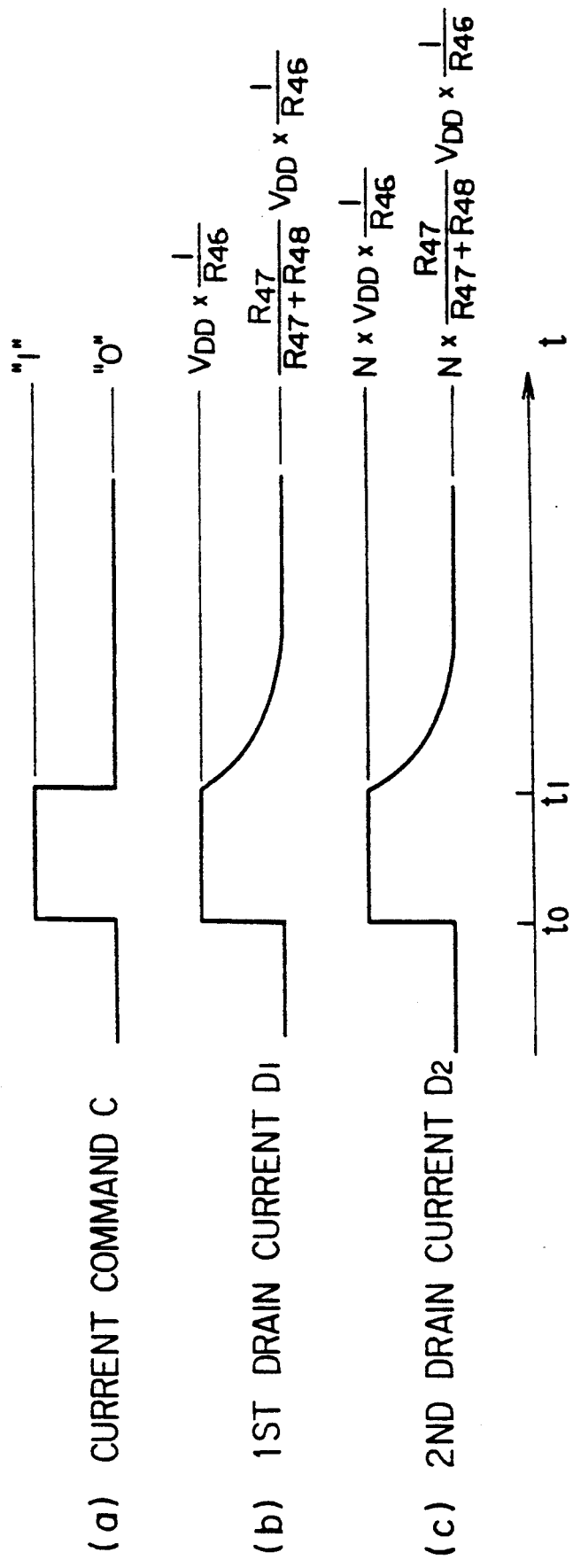
FIGS. 8 shows a time chart for use in describing operation of the charge-up control circuit illustrated in FIG. 7.

Turning to FIG. 8, (a) through (c), description will be made as regards operation of the charge-up control circuit of the current controlling circuit 35 illustrated in FIG. 7. It will be assumed that the first through the third resistors 46 to 48 have first through third resistance values, respectively, which are denoted to $R_{46}$, $R_{47}$, and $R_{48}$. The third resistance value $R_{48}$ is larger than the second resistance value $R_{47}$ FIG. 8, (a) through (c), shows the current command C (the charge-up indication signal), and the first and the second drain currents $D_1$ and $D_2$, respectively.

When the charge-up indication signal of the current command C is present or becomes the logic one value at a time instant $t_0$, the switching element 41 turns on. Therefore, the capacitor 49 is charged up to a voltage of $V_{DD}$. Through the n-channel MOSFET 43 flows the first drain current $D_1$ which has a current value of $V_{DD}/R_{46}$. Therefore, through the second p-channel MOSFET 45 flows the second drain current $D_2$ which has a current value of $N \times V_{DD}/R_{46}$.

When the charge-up indication signal of the current command C becomes absent or the logic zero value at a time instant $t_1$, the switching element 41 turns off. Therefore, the capacitor 49 is exponentially discharged up to a voltage of $R_{47}/(R_{47}+R_{48})) \times V_{DD}$. As a result, the first drain current $D_1$ exponentially decreases up to a current value of $(R_{47}/((R_{47}+R_{48})) \times V_{DD}/R_{46}$. Accordingly, the second drain current $D_2$ exponentially decreases up to a current value of $N \times (R_{47}/(R_{47}+R_{48})) \times V_{DD}/R_{46}$. At any rate, the charge-up control circuit of the current controlling circuit carries out, in response to the charge-up indication signal of the current command, C, charge-up of the loop filter through the p-channel MOSFET in the charge pump circuit when the p-channel MOSFET is put into the ON state.

The discharge control circuit of the current controlling circuit 35 is similar in structure and operation to the charge-up control circuit illustrated in FIG. 7 except that the n-channel MOSFET 43 is replaced with a p-channel MOSFET, the p-channel MOSFETs 44 and 45 are replaced with n-channel MOSFETs, the positive source voltage $+V_{DD}$ and the ground are exchanged with each other, and the discharge control circuit is supplied with the discharge indication signal of the current command C in place of the charge-up indication signal. In operation which is similar to that of the charge-up control circuit, the discharge control circuit carries out, in response to the discharge indication signal of the current command, discharge of the loop filter through the n-channel MOSFET in the charge pump circuit. As a result, the charge-up and the discharge of the loop filter are independently controlled by the charge-up control circuit and the discharge control circuit respectively.

Figure 9:
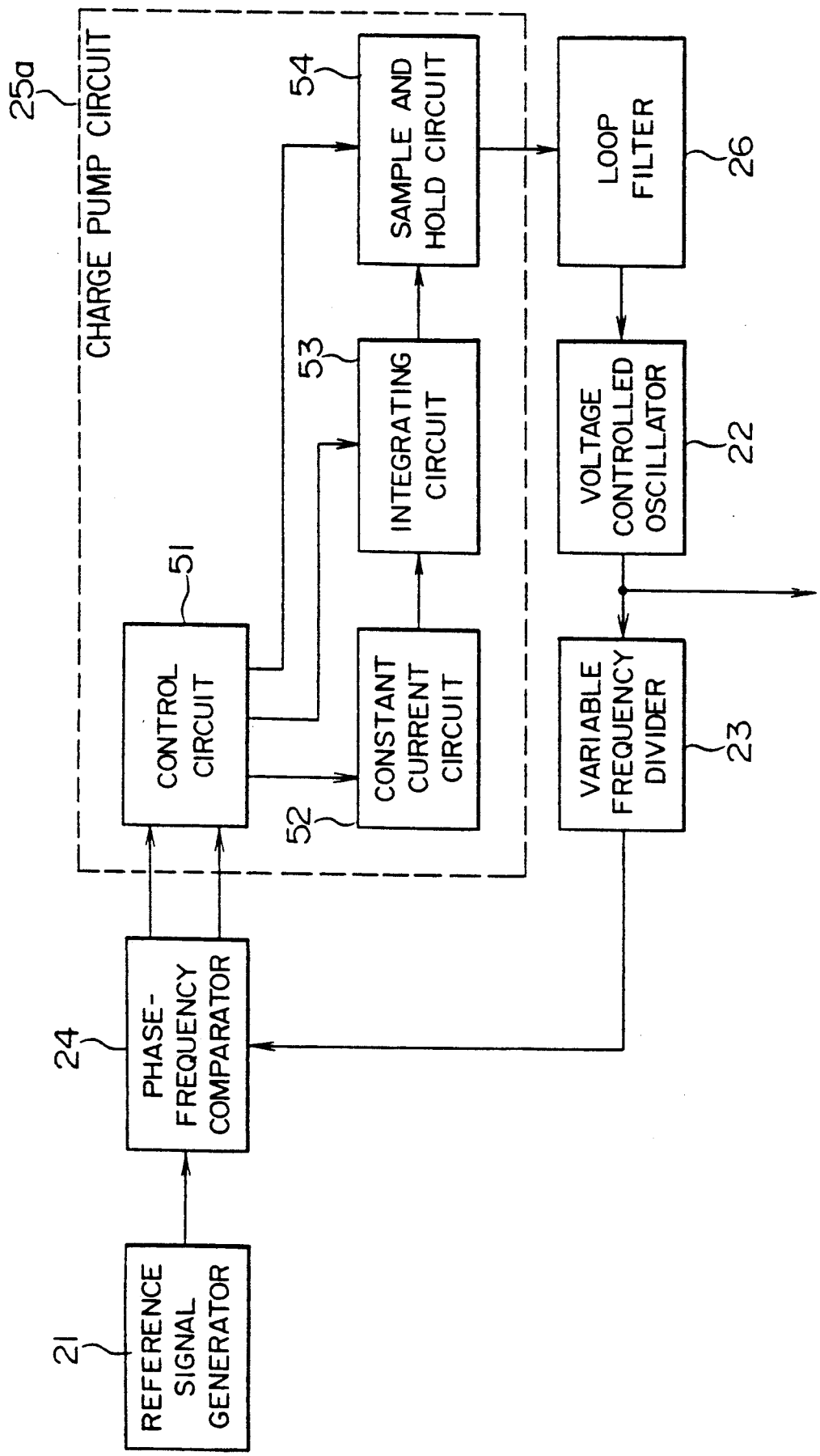
FIG. 9 is a block diagram of a PLL frequency synthesizer according to a third embodiment of the instant invention.

Referring to FIG. 9, the description will proceed to a PLL frequency synthesizer according to a third embodiment of this invention. The PLL frequency synthesizer is similar in structure and operation to the conventional PLL frequency synthesizer illustrated in FIG. 1 except that the charge pump circuit is modified from that illustrated in FIG. 1 as will later become clear. The charge pump circuit is therefore depicted at 25a.

The illustrated charge pump circuit 25a comprises a control circuit 51, a constant current circuit 52, an integrating circuit 53, and a sample and hold circuit 54.

The control circuit 51 is connected to the phase-frequency comparator 24. Responsive to the phase-frequency difference signal, the control circuit 51 produces first through third control signals. The first through the third control signals are supplied to the constant current circuit 52, the integrating circuit 53, and the sample and hold circuit 54, respectively.

Responsive to the first control signal, the constant current circuit 52 produces a constant current. The constant current is supplied to the integrating circuit 53. The integrating circuit 53 has an initial voltage. The integrating circuit 53 integrates the constant current to an integrated voltage. The integrating circuit 53 is reset from the integrated voltage to the initial voltage in response to the second control signal. The integrated voltage is supplied to the sample and hold circuit 54. Responsive to the third control signal, the sample and hold circuit 44 samples the integrated voltage to hold a sampled voltage as a held signal. The sample and hold circuit 44 supplies the held signal to the loop filter 26 as the current flow control signal.

Figure 10:
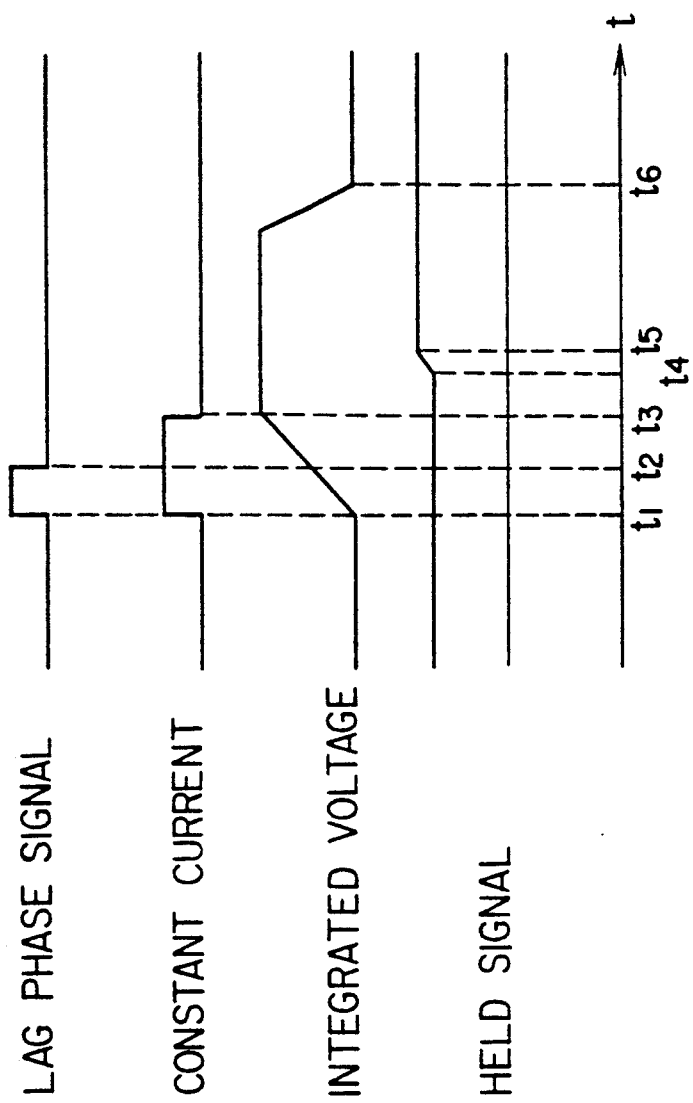
FIG. 10 shows a time chart for use in describing operation of a charge pump circuit of the PLL frequency synthesizer illustrated in FIG. 9.

Referring to FIG. 10 in addition to FIG. 9, description will be made as regards operation of the charge pump circuit 25a. In FIG. 10, the lag phase signal, the constant current, the integrated voltage, and the held signal are depicted along first through fourth lines.

As shown in the first line in FIG. 10, the lag phase signal is supplied from the phase-frequency comparator 24 to the control circuit 51 during a first time duration between a first time instant $t_1$ and a second time instant $t_2$. Under the circumstances, the control circuit 51 produces the first control signal during a second time duration between the first time instant $t_1$ and a third time instant $t_3$. Responsive to the first control signal, the constant current circuit 52 produces the constant current during the second time duration as shown in the second line in FIG. 10. Therefore, the integrating circuit 53 integrates the constant current to the integrated voltage during the second time duration as shown in the third line in FIG. 10. After the third time instant $t_3$, the integrating circuit 53 keeps the integrated voltage. At a fourth time instant $t_4$, the control circuit 51 produces the third control signal. Responsive to the third control signal, the sample and hold circuit 44 samples the integrated voltage to hold a sampled voltage as a held signal at a fifth time instant $t_5$. The held signal is supplied to the loop filter 26 as the current flow control signal. At a sixth time instant $t_6$, the control circuit 51 produces the second control signal. Responsive to the second control signal, the integrating circuit 53 is reset from the integrated voltage to the initial voltage. Therefore, the charge pump circuit 25a increases a level of the current flow control signal in response to the lag phase signal. In the similar operation, the charge pump circuit 25a decreases the level of the current flow control signal in response to the lead phase signal.

It is understood that it is possible to set a desired value to a gain of the charge pump circuit 25a by changing the ratio of the first time duration to the second time duration.

Figure 11:
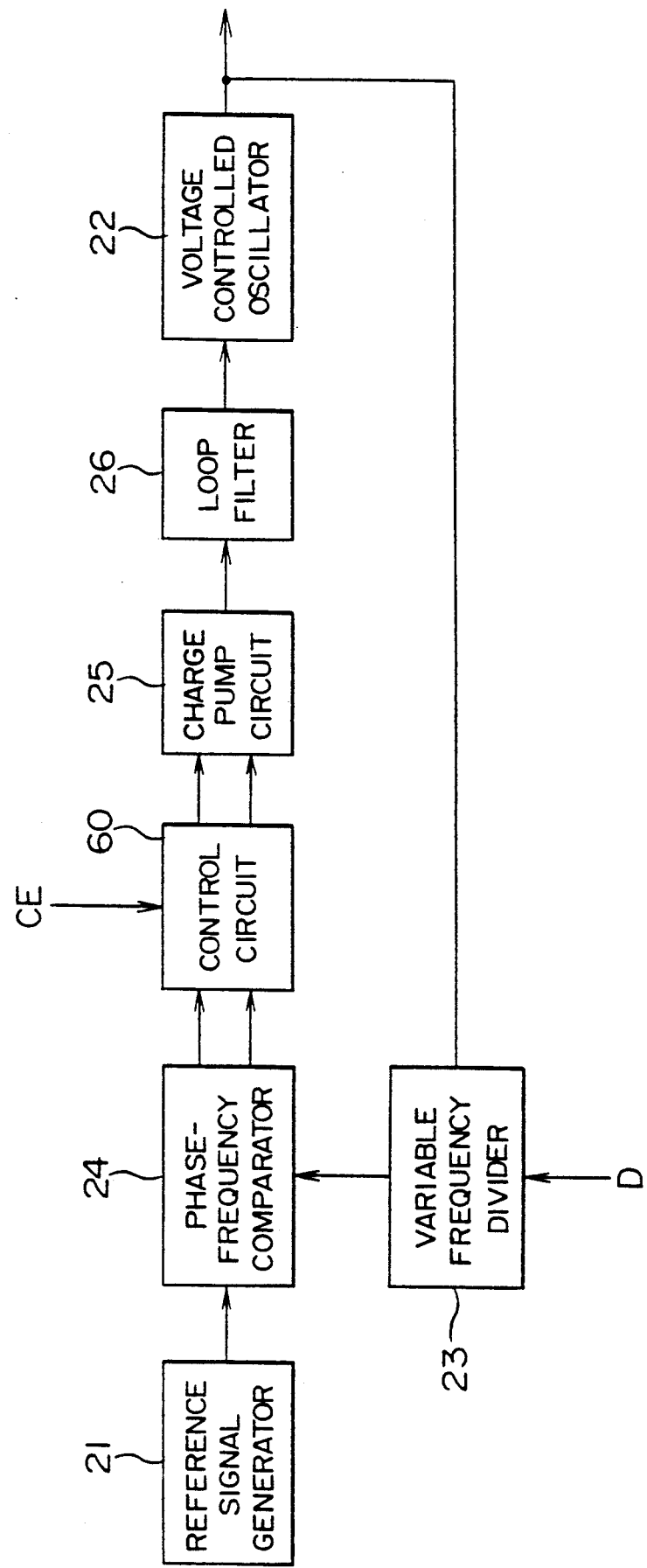
FIG. 11 is a block diagram of a PLL frequency synthesizer according to a fourth embodiment of the instant invention.

Referring to FIG. 11, the description will proceed to a PLL frequency synthesizer according to a fourth embodiment of this invention. The PLL frequency synthesizer is similar in structure and operation to the conventional PLL frequency synthesizer illustrated in FIG. 1 except that the PLL frequency synthesizer further comprises a control circuit 60.

The control circuit 60 is connected between the phase-frequency comparator 24 and the charge pump circuit 25. The control circuit 60 is supplied with a control enable signal CE. Responsive to the control enable signal CE, the control circuit 60 acts as a modifying arrangement for modifying the phase-frequency difference signal into a modified signal. Instead of the phase-frequency difference signal, the modified signal is supplied to the charge pump circuit 25. Therefore, the charge pump circuit 25 controls, in response to the modified signal, flow-in and flow-out of the current supplied therefrom/to to produce the current flow control signal. A little more in detail, the control circuit 60 is operable in one of a first mode and a second mode. At first, the first mode will be described. The second mode will be described later in the following.

In the first mode, the control enable signal CE is present while the output frequency is changed. The phase-frequency difference signal comprises a pulse sequence having pulses for a predetermined cycle that are equal in number to a controllable number. When the control enable signal CE is present, the control circuit 60 gradually decreases the controllable number until at last a predetermined final number. The predetermined final number is, for example, one sixty-fourths as large as the controllable number before being decreased.

Figure 12:
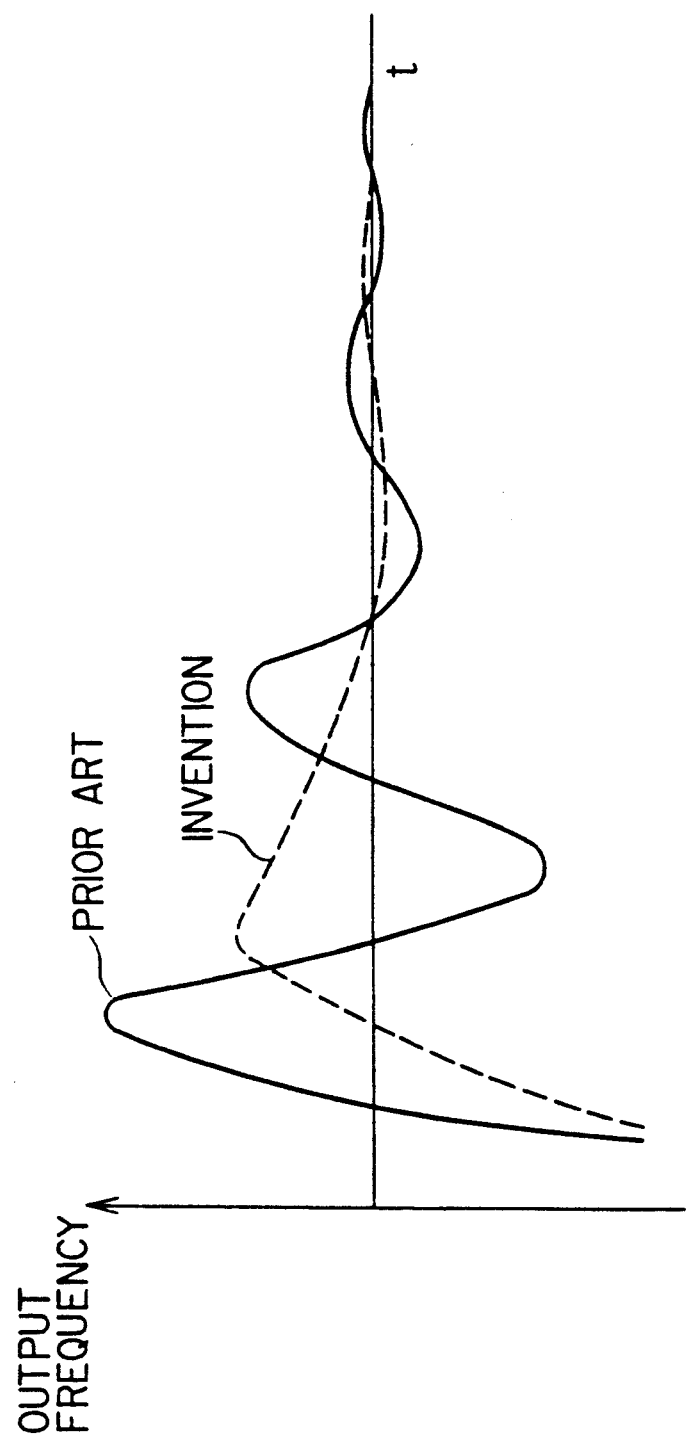
FIG. 12 shows a time chart for use in describing operation of the PLL frequency synthesizer illustrated in FIGS. 1 and 11.

FIG. 12 shows transient responses of the output frequency in the conventional PLL frequency synthesizer (FIG. 1) and the PLL frequency synthesizer according to the fourth embodiment. In FIG. 12, a transient response for the conventional PLL frequency synthesizer is depicted at a solid line. Another transient response for the PLL frequency synthesizer according to the fourth embodiment is depicted at a dotted line. As apparent from FIG. 12, it is possible to raise up the transient response by decreasing the controllable number.

In the second mode, the control enable signal CE is present in a steady state of the PLL frequency synthesizer. The phase-frequency difference signal comprises a pulse sequence having pulses each of which has a controllable pulse width. The control circuit 60 narrows the controllable pulse width when the control enable signal CE is present. It is possible to improve unstableness in the PLL frequency synthesizer.

Figure 13:
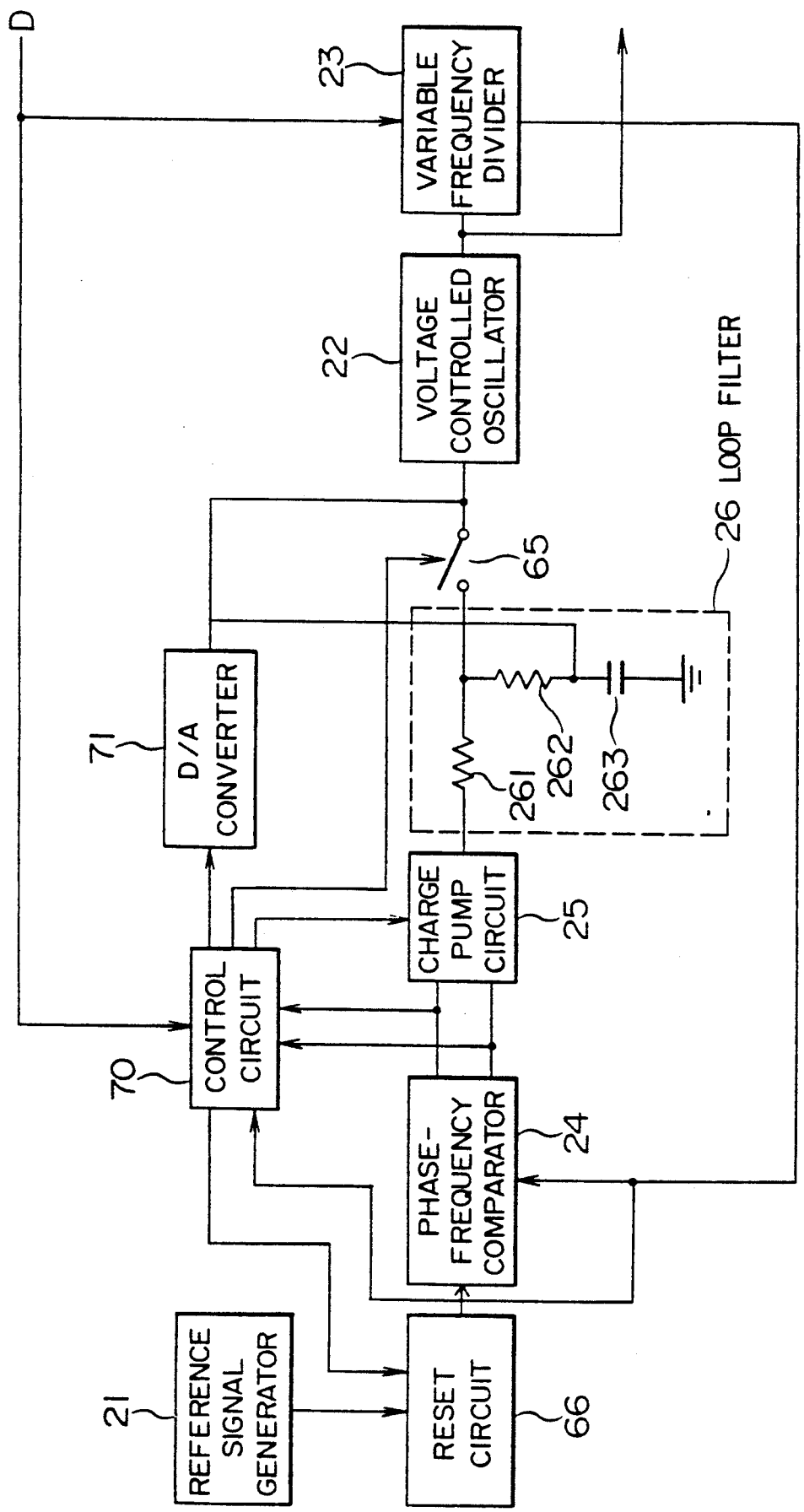
FIG. 13 is a block diagram of a PLL frequency synthesizer according to a fifth embodiment of the instant invention.

Referring to FIG. 13, the description will proceed to a PLL frequency synthesizer according to a fifth embodiment of this invention. The PLL frequency synthesizer is similar in structure and operation to the conventional PLL frequency synthesizer except that the PLL frequency synthesizer further comprises a switch 65, a reset circuit 66, a control circuit 70, and a digital-analog converter 71.

The control circuit 70 is supplied with the designated dividing number D, the divided signal, the phase-frequency difference signal. On changing the output frequency, the control circuit 70 produces first and second control signals. The control circuit 70 also produces voltage data on changing the output frequency. The voltage data represents a control voltage which is defined by the designated dividing number D on the basis of the phase-frequency difference signal. The control circuit 70 determines the voltage data by carrying out binary search on the phase-frequency difference signal.

The switch 65 is inserted between the loop filter 26 and the voltage controlled oscillator 22. The switch 65 is supplied with the first control signal. The switch 65 switches off in response to the first control signal.

The loop filter 26 comprises first and second resistors 261 and 262 and a filter capacitor 263. The first resistor 261 has one end connected to the charge pump circuit 25 and has another end connected to the switch 65 and to one end of the second resistor. The second resistor 262 has another end connected to one end of the filter capacitor 263 which has another end grounded.

The digital-analog converter 71 is supplied with the voltage data from the control circuit 70. The digital-analog converter 71 is activated only when the output frequency is changed. The digital-analog converter 71 converts the voltage data into the control voltage. The control voltage is supplied to the voltage controlled oscillator 22 and the filter capacitor 263 of the loop filter 26.

Responsive to the second control signal, the charge pump circuit 25 is unactivated or put into a high impedance state.

The reset circuit 66 is inserted between the reference signal generator 29 and the phase-frequency comparator 24. On the basis of the divided signal, the control circuit 70 controls the reset circuit 66 so as to make the reset circuit 66 produce a reset signal which has a phase equal to that of the divided signal. The reset signal is supplied to the phase-frequency comparator 24 instead of the reference signal.

Figure 14:
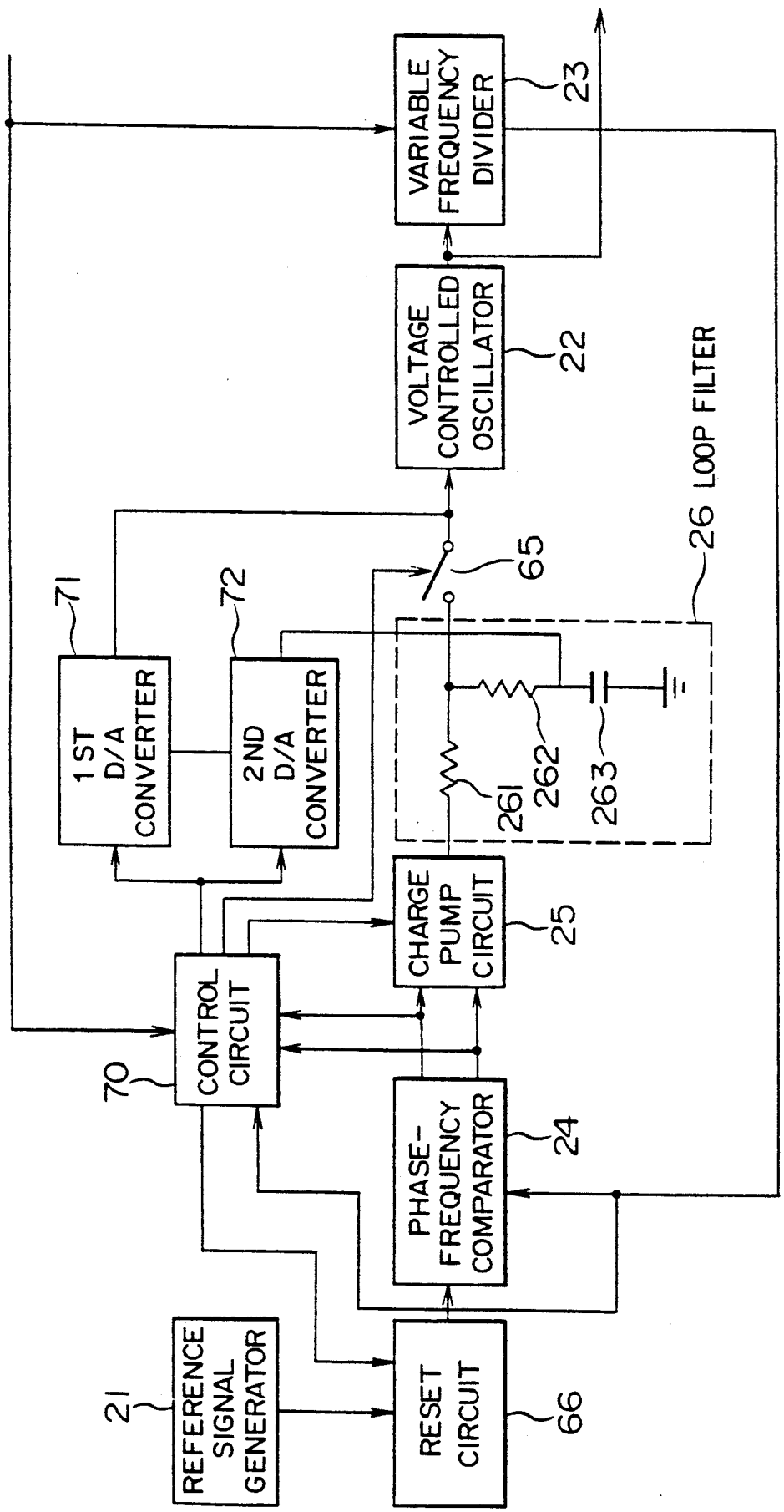
FIG. 14 shows a block diagram of a PLL frequency synthesizer which modifies the PLL frequency synthesizer illustrated in FIG. 12.

In the PLL frequency synthesizer illustrated in FIG. 13, the digital-analog converter 71 supplies the control voltage to both of the voltage controlled oscillator 22 and the filter capacitor 263 of the loop filter 26. The digital-analog converter 71 may be modified into first and second digital-analog converters 71 and 72 as shown in FIG. 14. Under the circumstances, the first digital-analog converter 71 supplies the control voltage to the voltage controlled oscillator 22. The second digital-analog converter 72 supplies the control voltage to the filter capacitor 263 of the loop filter 26.

What is claimed is:

1. A frequency synthesizer comprising:

a reference signal generator for generating a reference signal with a reference frequency;

a voltage controlled oscillator responsive to a control voltage signal for generating an output signal having an output frequency;

a variable frequency divider supplied with said output signal and responsive to a designated dividing number defining said output frequency for frequency dividing said output signal on the basis of said designated dividing number to produce a divided signal;

a phase-frequency comparator supplied with said reference signal and said divided signal for detecting a phase-frequency difference between said reference signal and said divided signal to produce a phase-frequency difference signal indicative of one of lag and lead phases with said divided signal has in comparison with said reference signal, said phase-frequency difference signal comprising lag and lead phase signals which indicate the length and the lead phases, respectively;

a current flow control circuit responsive to said phase-frequency difference signal for controlling flow-in and flow-out of current signal supplied therefrom/to to produce a current flow control signal, said current flow control circuit consisting of a p-channel MOSFET and an n-channel MOSFET each of which has a gate terminal, a drain terminal, and a source terminal and which are joined at the drain terminals thereof, the gate terminal of said p-channel MOSFET being supplied with said lag phase signal, the gate terminal of said n-channel MOSFET being supplied with said lead phase signal, said p-channel MOSFET being put into an ON state in response to said lag phase signal, said n-channel MOSFET being put into an ON state in response to said lead phase signal;

a loop filter supplied with said current flow control signal for filtering said current flow control signal into a filtered signal as said control voltage signal; and a current controlling circuit responsive to a current command for controlling said current supplied from/to said current flow control circuit, said current command comprising charge-up and said discharge indication signals, said current controlling circuit comprising a charge-up control circuit and a discharge control circuit, said charge-up control circuit being supplied with said charge-up indication signal and being connected to the source terminal of said p-channel MOSFET, said discharge control circuit being supplied with said discharge indication signal and being connected to the source terminal of said n-channel MOSFET, whereby said charge-up control circuit carries out, in response to said charge-up indication signal, charge-up of said loop filter through said p-channel MOSFET when said p-channel MOSFET is put into the ON state while said discharge control circuit carries out, in response to said discharge indication signal, discharge of said loop filter through said n-channel MOSFET when said n-channel MOSFET is put into the ON state.

2. A frequency synthesizer as claimed in claim 1, the charge-up and discharge indication signals of said current command being present one at a time while said output frequency is changed, wherein said charge-up control circuit of said current controlling circuit controls said current so as to increase said current when the charge-up indication signal of said current command is present and then to gradually decrease said current after the charge-up indication signal of said current command becomes absent, said discharge control circuit of said current controlling circuit controls said current so as to increase said current when the discharge indication signal of said current command is present and then to gradually decrease said current after the discharge indication signal of said current command becomes absent.

3. A frequency synthesizer as claimed in claim 2, wherein said charge-up control circuit of said current controlling circuit comprise:

a primary operational amplifier having a primary inverting input terminal, a primary noninverting input terminal, and a primary amplifier output terminal, the primary inverting input terminal being grounded via a first primary resistor, the primary noninverting input terminal being grounded via a second primary resistor and a primary capacitor which are connected with each other in parallel, the primary noninverting input terminal being supplied with a positive source voltage via a third primary resistor;

a primary switching element, supplied with the charge-up indication signal of said the current command and the positive source voltage and connected to the primary noninverting input terminal of said primary operational amplifier, for turning on when the charge-up indication signal of the current command is present to supply the positive source voltage to the primary noninverting input terminal of said first operational amplifiers;

a primary n-channel MOSFET having a primary gate terminal connected to the primary amplifier output terminal and a primary source terminal connected to the primary inverting input terminal of said primary operational amplifier; and a primary current Miller circuit connected to a primary drain terminal of said primary n-channel MOSFET, the source terminal of said p-channel MOSFET in said current flow control circuit and supplied with the positive source voltage; and wherein said discharge control circuit of said current controlling circuit comprises:

a secondary operational amplifier having a secondary inverting input terminal, a secondary noninverting input terminal, and a secondary amplifier output terminal, the secondary inverting input terminal being supplied with the positive source voltage via a first secondary resistor, the secondary noninverting input terminal being supplied with the positive source voltage via a second secondary resistor and a secondary capacitor which are connected with each other in parallel, the secondary noninverting input terminal being grounded via a third secondary resistor;

a secondary switching element, supplied with the discharge indications signal of the current command and ground voltage and connected to the secondary noninverting input terminal of said secondary operational amplifier, for turning on when the discharge indication signal of said the current command is present to supply the ground voltage to the secondary noninverting input terminal of said secondary operational amplifier;

a secondary p-channel MOSFET having a secondary gate terminal connected to the secondary amplifier output terminal and a secondary source terminal connected to the second inverting input terminal of said secondary operational amplifier; and a second current Miller circuit connected to a secondary drain terminal of said secondary p-channel MOSFET, the source terminal of said n-channel MOSFET in said current flow control circuit and supplied with the ground voltage.

* * * * *